(12) United States Patent
Van Duuren et al.

(10) Patent No.: US 7,045,852 B2
(45) Date of Patent: May 16, 2006

(54) FLOATING GATE MEMORY CELLS WITH INCREASED COUPLING RADIO

(75) Inventors: Michiel Jos Van Duuren, Leuven (BE); Robertus Theodorus Fransiscus Van Schaijk, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 13 days.

(21) Appl. No.: 10/513,874

(22) PCT Filed: Apr. 11, 2003

(86) PCT No.: PCT/IB03/01485

§ 371 (c)(1),
(2), (4) Date: Nov. 5, 2004

(87) PCT Pub. No.: WO03/096431

PCT Pub. Date: Nov. 20, 2003

(65) Prior Publication Data

US 2005/0218445 A1 Oct. 6, 2005

(30) Foreign Application Priority Data

May 8, 2002 (EP) .................................. 02076771

(51) Int. Cl.
*H01L 29/788* (2006.01)
*H01L 21/336* (2006.01)

(52) U.S. Cl. .............................. 257/316; 257/E29.152
(58) Field of Classification Search ................. 257/316
See application file for complete search history.

(56) References Cited

U.S. PATENT DOCUMENTS

| 5,284,784 | A | * | 2/1994 | Manley | ....................... 438/263 |
| 5,576,232 | A | * | 11/1996 | Hong | ......................... 438/264 |
| 5,650,345 | A | | 7/1997 | Ogura et al. | |
| 6,204,122 | B1 | * | 3/2001 | Joo et al. | ..................... 438/257 |

* cited by examiner

*Primary Examiner*—W. David Coleman
(74) *Attorney, Agent, or Firm*—Peter Zawilski

(57) ABSTRACT

A method to improve the coupling ratio between a control gate (18) and a floating gate (14) of a floating gate non-volatile semiconductor device is described. In a stacked gate floating gate transistor according to the invention, a conductive spacer (24) is used at both sides of the stack. The conductive spacer (24) is galvanically connected to the control gate (18), preferably by means of a conductive layer (34), whereas it is separated from the floating gate (14) by means of an insulating layer (22). The capacitance (C1, C2) between both conductive spacers (24) and the side walls of the floating gate (14) adds up to the normal capacitance between control gate (18) and floating gate (14).

23 Claims, 5 Drawing Sheets

FLOATING GATE MEMORY CELLS WITH INCREASED COUPLING RADIO

The present invention relates to a non-volatile floating gate semiconductor memory device with increased floating gate (FG) to control gate (CG) coupling ratio (also called coupling coefficient), a method of forming such semiconductor device and ultra-high density non-volatile memories (NVM) using such semiconductor device. Some examples of NVMs include an EPROM, and EEPROM and a flash memory cell.

NVMs are used in a wide variety of commercial and military electronic devices and equipment, such as e.g. hand-held telephones, radios and digital cameras. The market for these electronic devices continues to demand devices with a lower supply voltage, lower power consumption and a decreased chip size.

Flash memories or flash memory cells comprise a MOSFET with a (or a plurality of) floating gate(s) between a control gate and a channel region, the floating gate(s) and the control gate being separated by a thin dielectric layer. With the improvement of fabrication technologies, the FG size has been reduced to sub-micron scale. Electrons (or holes) are injected in a floating gate by tunneling through an oxide barrier. Charges stored in the FG modify the device threshold voltage. In this way, data is stored. The CG controls the electrical potential of the FG. The FG to CG coupling ratio, which is related to the areal overlap between the FG and the CG, affects the read/write speed of the flash memory. Furthermore, the better (higher) the coupling ratio, the more the required operation voltage of the memory cell can be reduced.

Although the cell size of non-volatile FG cells has been decreasing continuously over the past years, the voltages needed for programming and erasing did not scale to the same extent. In advanced process generations, this becomes more and more of a burden, especially for embedded NVM applications, as it is increasingly difficult and expensive to integrate the associated high voltage transistors of the peripheral circuitry in these processes.

The above observation holds for any program/erase mechanism, but it is most obvious when the Fowler-Nordheim tunneling mechanism is used. The reason for the non-scaling program/erase voltages is merely the fact that, for reliability reasons, the tunnel oxide thickness does not scale anymore with the lateral size of the cells.

A solution for reducing the required CG voltage during program/erase is to increase the capacitive coupling ratio ($\alpha_{cg}$) between the CG and the FG. This solution is adopted for example in U.S. Pat. No. 6,069,382. A NVM cell is described there, which includes a FG having a bottom surface in contact with a tunnel layer formed on a substrate, a top surface and side wall surfaces oriented along two perpendicular directions of the memory cell. A dielectric layer covers at least a portion of the top surface and covers at least a portion of the surfaces oriented along the perpendicular directions. A CG overlaps the FG over substantially all of its surface area, the aforementioned dielectric layer separating the two gates galvanically. In this way, the coupling ratio between FG and CG is increased due to the increased overlap area, but also the cell size is increased.

It is an object of the present invention to provide a semiconductor device with increased FG to CG coupling ratio (increased $\alpha_{cg}$), without substantially increasing the device size, and a fabrication method thereof.

The above objective is accomplished by a device and method according to the present invention.

The present invention provides a non-volatile floating gate semiconductor memory device with an enhanced (increased) floating gate to control gate coupling ratio, comprising:

a substrate with a planar surface, a stack comprising a floating gate (FG) and a control gate (CG) on the substrate, the stack having two opposite walls extending substantially vertically with respect to the planar surface, a conductive spacer associated with each opposite wall of the stack, an insulating layer between each opposite wall of the stack and the associated conductive spacer, and a galvanic contact between each conductive spacer and the control gate.

Having a device with conductive spacers enables to use a self-aligned process to make it. Therefore, the semiconductor memory device obtained is smaller than the device obtained by the non-self-aligned process used to make prior art semiconductor memory devices.

The insulating layer may be formed by means of a blanket layer or by means of an insulating spacer. If an insulating spacer is used, the galvanic contact between each conductive spacer and the control gate may be formed by a direct contact between the conductive spacers and the control gate. In both cases (a blanket layer or an insulating spacer as side wall dielectric), the galvanic contact may be made by means of a conductive layer, e.g. a silicide layer, over at least a part of the conductive spacer and at least a part of the control gate. Both the conductive spacer and the control gate may be covered by the conductive layer everywhere where they are not covered by another layer. Insulating spacers may be provided alongside the conductive spacers.

The present invention also provides a method for manufacturing on a substrate with a planar surface a non-volatile floating gate semiconductor memory device with an enhanced (increased) floating gate to control gate coupling ratio is also provided. The method comprises the steps of:

forming a stack comprising a floating gate and a control gate on the substrate, the stack having two opposite walls extending substantially vertically with respect to the planar surface, forming a conductive spacer associated with each opposite wall of the stack, forming an insulating layer between each opposite wall of the stack and the associated conductive spacer, and forming a galvanic contact between each conductive spacer and the control gate.

By forming conductive spacers, a self-aligned process is used. Therefore, the semiconductor memory device obtained is smaller than the device obtained by a non-self-aligned process used to make prior art devices.

The step of forming an insulating layer may comprise depositing a blanket layer or forming insulating spacers. If insulating spacers are formed, the step of forming a galvanic contact may comprise providing a direct contact between a conductive spacer and the control gate. The step of forming a galvanic coupling between each conductive spacer and the control gate may also comprise forming a conductive layer, e.g. by silicidizing, over at least part of the control gate and over at least part of the conductive spacers.

Insulating spacers may be provided alongside the conductive spacers.

The present invention also provides a non-volatile memory including a semiconductor memory device according to the present invention. The non-volatile memory may for example be a flash memory or an EEPROM. Such a non-volatile memory including a semiconductor memory device according to the present invention can be made smaller than prior art non-volatile memories. The memory can be programmed and/or erased at lower voltages, thus relaxing the requirements on the high voltage transistors in the peripheral circuit. Alternatively, not using decreased voltages, such non-volatile memory can be used to have faster erase and programming times.

Other characteristics, features and advantages of the present invention will become apparent from the following detailed description, taken in conjunction with the accompanying drawings, which illustrate, by way of example, the principles of the invention.

This description is given for the sake of example only, without limiting the scope of the invention. The reference figures quoted below refer to the attached drawings.

In the different figures, the same reference numbers refer to the same or analogous elements.

The present invention will be described with respect to particular embodiments and with reference to certain drawings but the invention is not limited thereto but only by the claims. The drawings described are only schematic and are non-limiting. Where the term "comprising" is used in the present description and claims, is does not exclude other elements or steps. Where an indefinite or definite article when referring to a singular noun is used e.g. "a" or "an", "the", this includes a plural of that noun unless something else is specifically stated.

According to the present invention, in a first step, a substrate 10 or a well in a substrate is provided. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), a germanium (Ge), or a silicon germanium (SiGe) substrate. The "substrate" may include, for example, an insulating layer such as a $SiO_2$ or an $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. In the following processing will mainly be described with reference to silicon processing but the skilled person will appreciate that the present invention may be implemented based on other semiconductor material systems and that the skilled person can select suitable materials as equivalents of the dielectric and conductive materials described below.

Active areas are defined by means of field oxide 11, e.g. with a shallow trench insulation (STI) process. This defines the width W of the transistors, as represented in FIG. 2. FIG. 2 is a cross-section in a direction perpendicular to the cross-section of FIG. 1.

Figure 1:
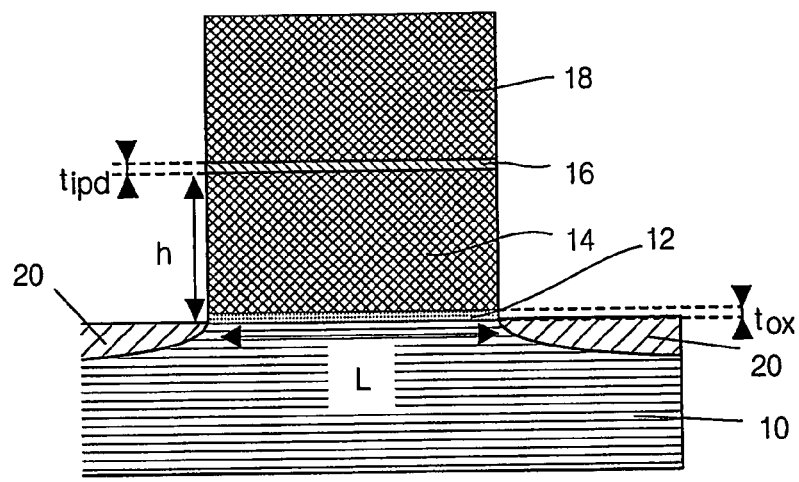
FIG. 1 is a schematic vertical cross-section of a conventional FG/dielectric/CG stack on a substrate surface.
Figure 2:
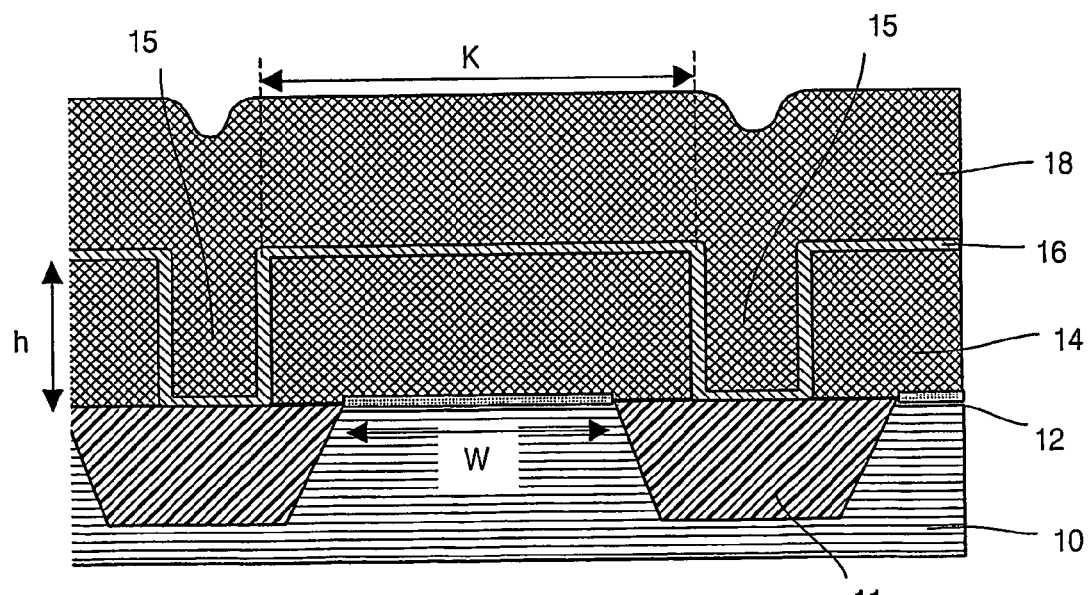
FIG. 2 is a schematic vertical cross-section of the FG/dielectric/CG stack of FIG. 1 in a direction perpendicular to the direction of the cross-section of FIG. 1.

As shown in FIG. 1, on top of the substrate 10, a tunnel oxide (Tox) layer 12, comprising silicon dioxide, is formed, e.g. by thermally growing it in an oxygen-steam ambient, at a temperature between about 600 to 1000° C., to a thickness between about 6 to 15 nm. Alternatively, for example, a dry oxidation can be used for growing the tunnel oxide layer 12.

On top of the tunnel oxide 12, a first polysilicon layer 14 is deposited, which will later on form the FG. The deposition of the first polysilicon layer is preferably done by a CVD procedure, to a thickness between about 50 to 400 nm. Doping of the polysilicon layer 14 is either accomplished in situ, during deposition, e.g. via the addition of arsine or phosphine to a silane ambient, or via an ion implantation procedure, using for example arsenic or phosphorous ions applied to an intrinsically polysilicon layer.

The first polysilicon layer 14 is patterned with slits 15, as illustrated in FIG. 2. These slits serve to isolate adjacent floating gates from each other (floating gates located on a same wordline but on different bitlines).

An interpoly dielectric (IPD) 16 is formed over the FG polysilicon layer 14. This IPD 16 comprises a dielectric material such as silicon oxide, and may be deposited via any suitable method such as an LPCVD or a PECVD procedure, to an equivalent oxide thickness (EOT) between about 10 to 30 nm. The IPD 16 preferably comprises other insulating materials, e.g. an Oxide Nitride Oxide (ONO) layer, and may be formed or grown by conventional techniques. An ONO layer comprises successive layers of silicon dioxide, silicon nitride and silicon dioxide.

After forming the IPD layer 16, CG polysilicon 18 is deposited. The deposition of the CG polysilicon layer 18 may be done by LPCVD procedures, to a thickness between about 50 to 400 nm. Doping of the CG polysilicon layer 18 is either accomplished in situ, during deposition, via the addition of a suitable dopant impurity such as arsine or phosphine to a silane ambient, or via an ion implantation procedure, using such a dopant, e.g. arsenic or phosphorous ions applied to an intrinsically polysilicon layer.

After formation of the layers 12, 14, 16, 18, a stack is etched, as shown in FIG. 1.

A lightly doped drain (LDD) or medium doped drain (MDD) implant 20 is carried out, i.e. an impurity implantation in the substrate 10 with a dose of the order of $10^{13}$–$10^{14}$ atoms per cm². The purpose of this LDD implant 20 is to create a reduced doping gradient between a drain/source to be formed and a channel under the tunnel oxide 12, which lowers the maximum electric field in the channel in the vicinity of the drain/source.

Up till here, a conventional process may be used.

Figure 3:
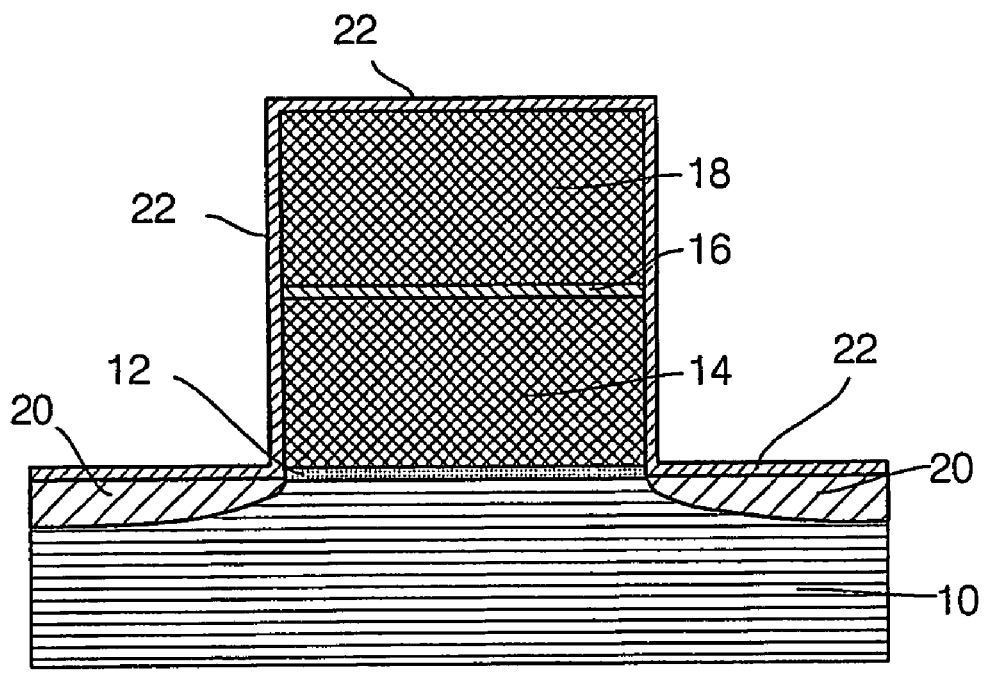
FIG. 3 is a schematic vertical cross-section of the stack of FIG. 1, over which a side wall dielectric has been provided according to an embodiment of the present invention, the side wall dielectric being a blanket layer.
Figure 4:
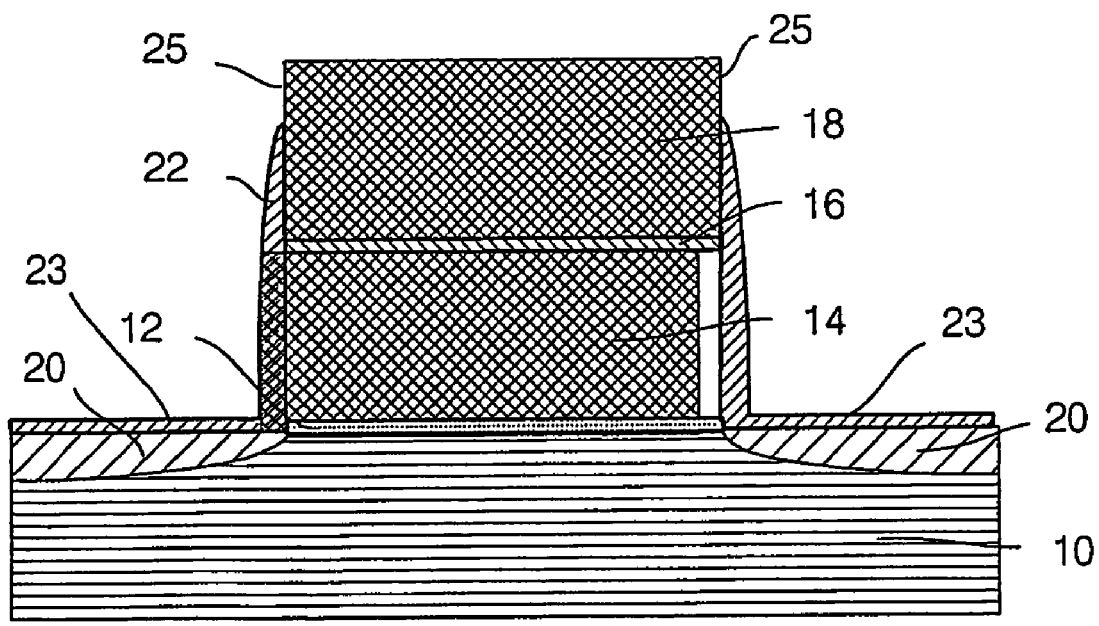
FIG. 4 is a schematic vertical cross-section of the stack of FIG. 1, over which a side wall dielectric has been provided according to an embodiment of the present invention, the side wall dielectric being a TEOS spacer.

Thereafter, as shown in FIG. 3 and in FIG. 4, a side wall dielectric 22—for instance (nitrided) silicon oxide—is deposited or grown over the substrate 10 and gate stack 14, 16, 18. This can be done as a blanket layer, as shown in FIG. 3, but alternatively dielectric spacers, such as TEOS spacers, can be used, as shown in FIG. 4. The use of a blanket layer has the advantage that the step coverage is very good. The use of a dielectric spacer has the disadvantage that the creation of the bottom insulation of the conductive spacers 24 (between the conductive spacers 24 and source/drain 28,30) requires additional process steps so as to form insulator layer 23. However, it has another advantage, as explained later with regard to FIG. 10. A suitable dielectric spacer over-etch may be used, so that the top side wall 25 of the CG is not covered by dielectric spacer 22. Instead of TEOS spacers also nitride spacers may be used. The side wall dielectric 22 preferably has an electrical thickness of the same order as that of the IPD 16.

Figure 5:
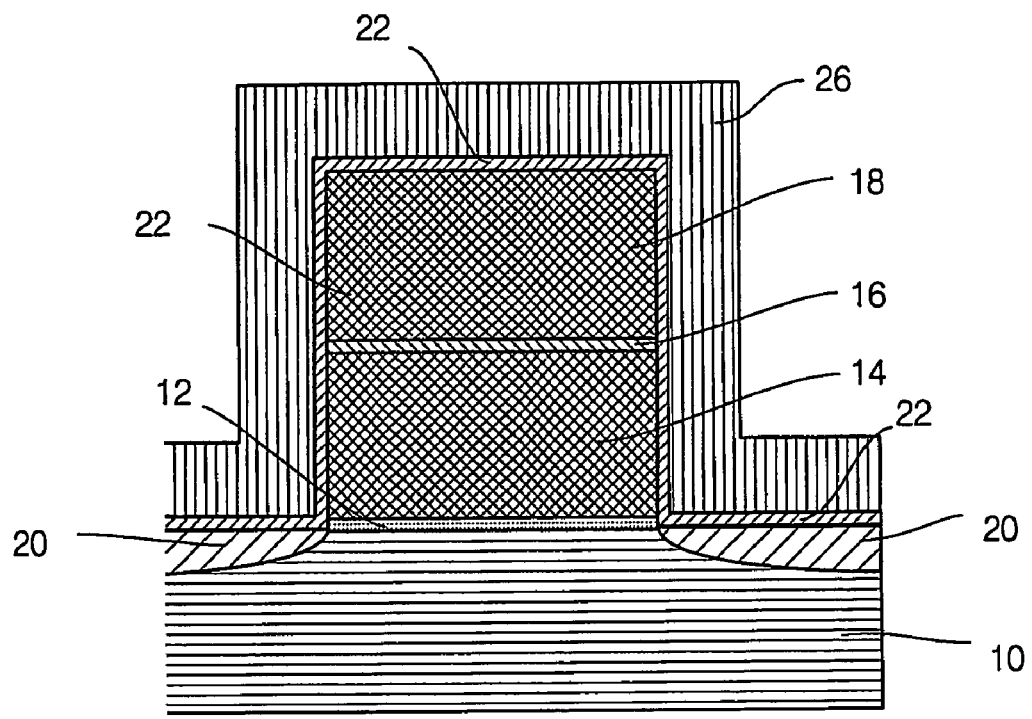
FIG. 5 is a schematic vertical cross-section of the semiconductor device of FIG. 3, over which a conductive layer is formed.
Figure 6:
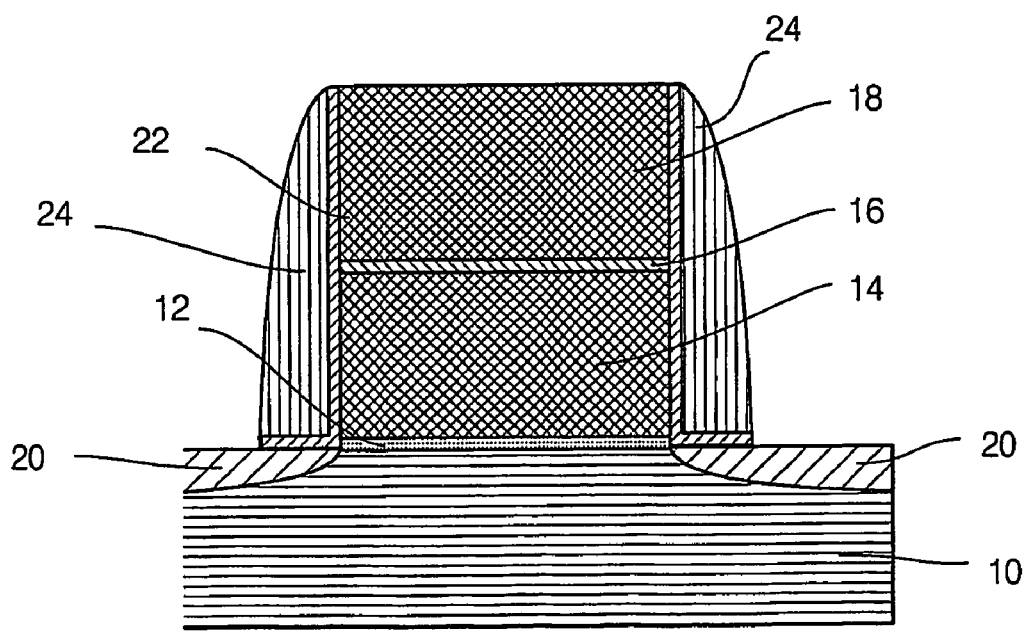
FIG. 6 is a schematic vertical cross-section of the semiconductor device of FIG. 5, where conductive spacers have been formed according to the present invention.

Next, conductive spacers 24 (see FIG. 6), for example polysilicon spacers, are formed along the gate stack 14, 16, 18. This may be done by first forming a polysilicon layer 26 over the side wall dielectric 22, as shown in FIG. 5, which is referring to the case in which the side wall dielectric 22 has been formed by a blanket layer (FIG. 3). Thereafter, an anisotropic etch is carried out, using the side wall dielectric 22 for end point detection of the main etch. It is to be noted that this is a self-aligned process without a masking step. The polysilicon spacer etch is followed by an etch removing all the uncovered side wall dielectric 22. The result is shown in FIG. 6.

In case the side wall dielectric 22 has been formed by a dielectric spacer (as in FIG. 4), a masking step is needed before anisotropically etching the polysilicon layer 26. The polysilicon spacer etch is followed by an etch removing all the uncovered parts of insulator layer 23.

In case of the use of a blanket layer as side wall dielectric 22, the polysilicon spacers 24 are insulated from both the floating gate 14 and the control gate 18 by means of the side wall dielectric 22. In case of the use of an over-etched TEOS spacer, the floating gate 14 is insulated from the polysilicon spacers 24 by means of the TEOS spacer, while the control gate 18 is only partially insulated from the polysilicon spacers 24 (the top side wall 25 of the control gate 18 directly contacts a polysilicon spacer 24).

Figure 7:
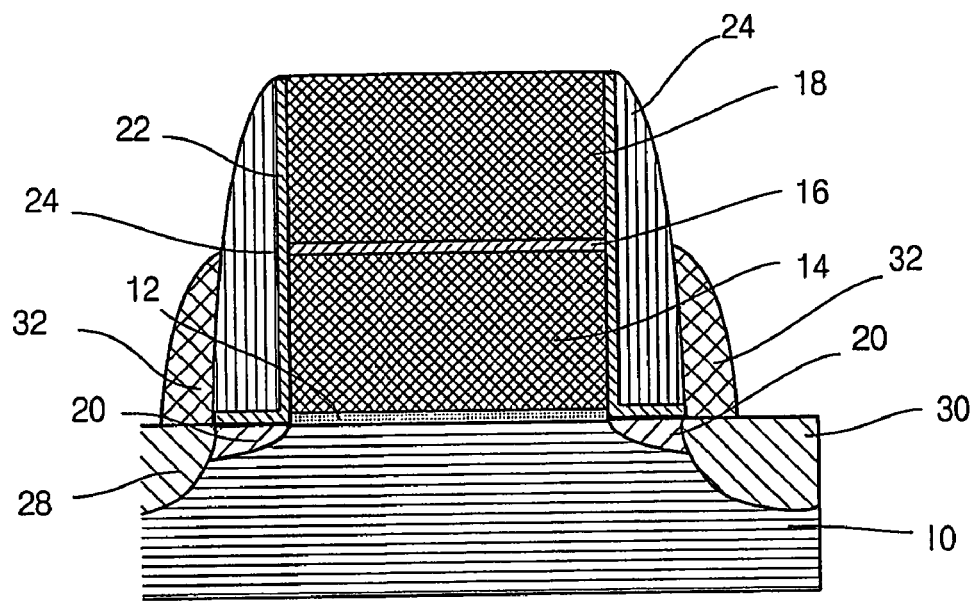
FIG. 7 is a schematic vertical cross-section of a first embodiment of the semiconductor device of FIG. 6 after formation of highly doped drain and source regions and of insulating spacers.

Subsequently, the polysilicon spacers 24 can serve as offset spacers for a highly doped drain (HDD) implant, thus forming source and drain regions 28, 30, as shown in FIG. 7. A highly doped implant has an impurity concentration of the order of $10^{15}$ atoms per cm². The stacked gate does not overlap with the heavily doped source and drain regions 28, 30. As said previously, the LDD structure 20 ensures a low dopant gradient in the drain channel region, which reduces the maximum electric field in the drain-channel and source-channel interfaces.

After this highly doped implant and its activation, insulating spacers 32, e.g. nitride spacers or TEOS spacers, are formed alongside the polysilicon spacers 24. In a 0.12 µm process, for example combined TEOS-nitride spacers may be used, the total thickness of the combined spacer being about 80 nm (20 nm TEOS and 60 nm nitride for example). The composition and dimensions of the spacers may vary. The insulating spacers 32 will prevent bridging between the conductive spacers 24 and the source and drain regions 28, 30 during a subsequent silicidation step, as this would short circuit the CG 18 to the source and drain regions 28, 30. The new situation is shown in FIG. 7.

Figure 8:
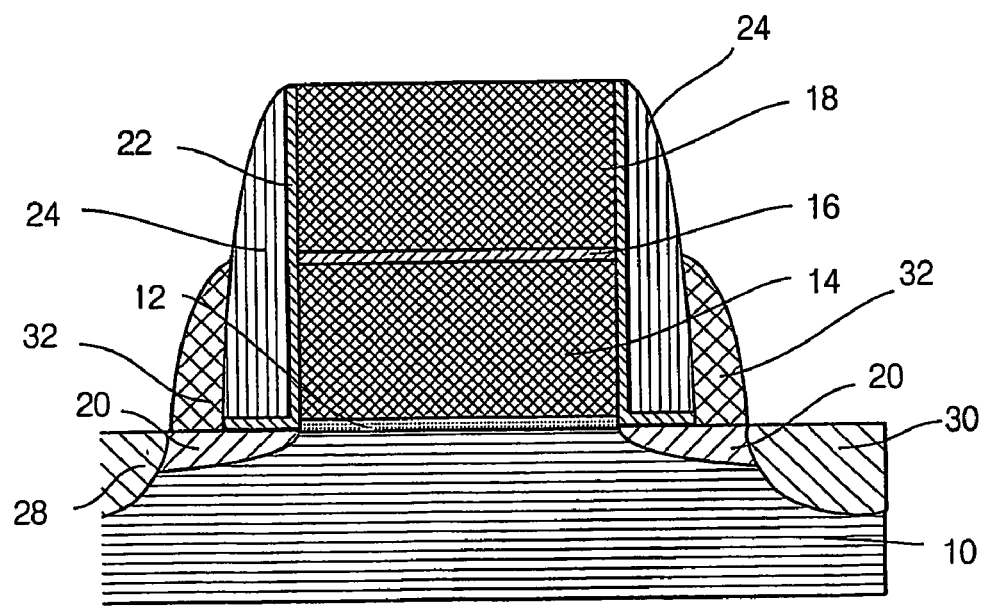
FIG. 8 is a schematic vertical cross-section of a second embodiment of the semiconductor device of FIG. 6 after formation of insulating spacers and of highly doped drain and source regions.

In an alternative embodiment, the HDD implant can be done after the formation of the insulating spacers 32, in which case the LDD/MDD region 20 will be longer, as shown in FIG. 8. This approach is easier to integrate into an existing CMOS process, ass HDD implants are normally done after spacer formation.

If the insulating spacers are used to define the HDD offset, as in the embodiment of FIG. 8, their size is critical. If they only serve to prevent bridging (as in the embodiment of FIG. 7), the dimensions are less critical or not critical at all.

Finally, to finish the front-end processing in case a blanket layer side wall dielectric 22 has been used, the uncovered silicon and polysilicon areas are provided with a conductive layer 34, for example they may be silicidized. The polysilicon spacer 24 is silicidized everywhere where it is not covered by another layer (in casu insulating spacer 32). No bridging across the insulating spacer 32 should occur. Because of the very short distance between the polysilicon spacers 24 and the control gate 18 (the sidewall dielectric 22 preferably has a thickness of less than 30 µm), bridging occurs and the spacers 24 and the CG 18 will be interconnected at the positions labeled B1, B2 in FIG. 9. It is to be noted that the CG 18 and polysilicon spacers 24 are adjacent along the entire word line length (which is the direction perpendicular to the plane of the paper), which implies that a local absence of bridging does not hamper cell operation.

Figure 10:
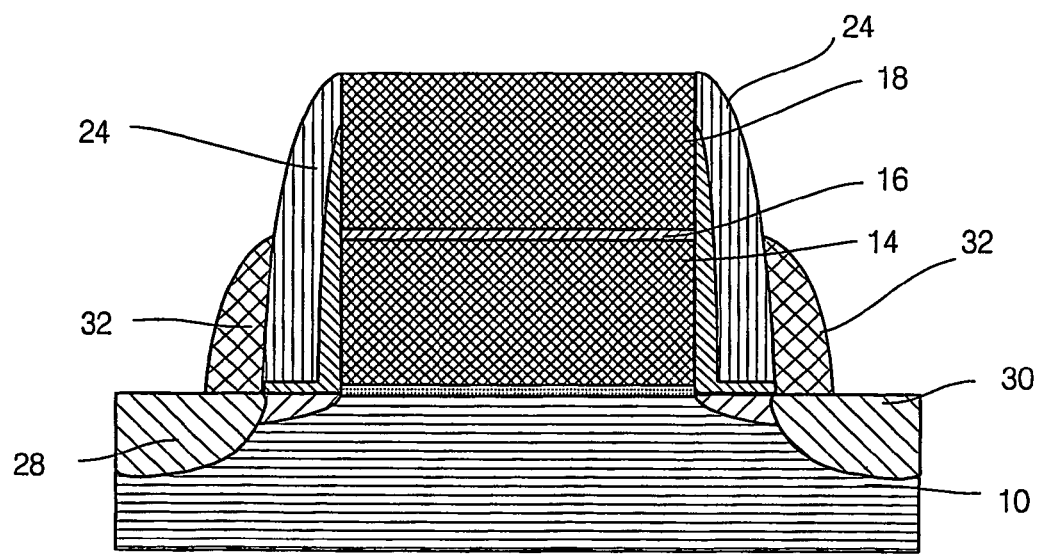
FIG. 10 is a schematic vertical cross-section of a semiconductor device according to the present invention, wherein the side wall dielectric has been formed by means of a TEOS spacer.

In case a TEOS spacer has been provided as side wall dielectric 22, the polysilicon spacer 24 is directly shorted to the CG 18, and thus a galvanic contact between polysilicon spacer 24 and CG 18 is obtained. However, a conductive layer (not represented in the drawings) may still be provided, e.g. by silicidizing uncovered silicon and polysilicon areas. A cross section of a layout of a cell according to this embodiment of the present invention, but without supplementary conductive layer, is shown in FIG. 10.

After the above steps, standard back-end processing can be applied to finish the memory.

Figure 9:
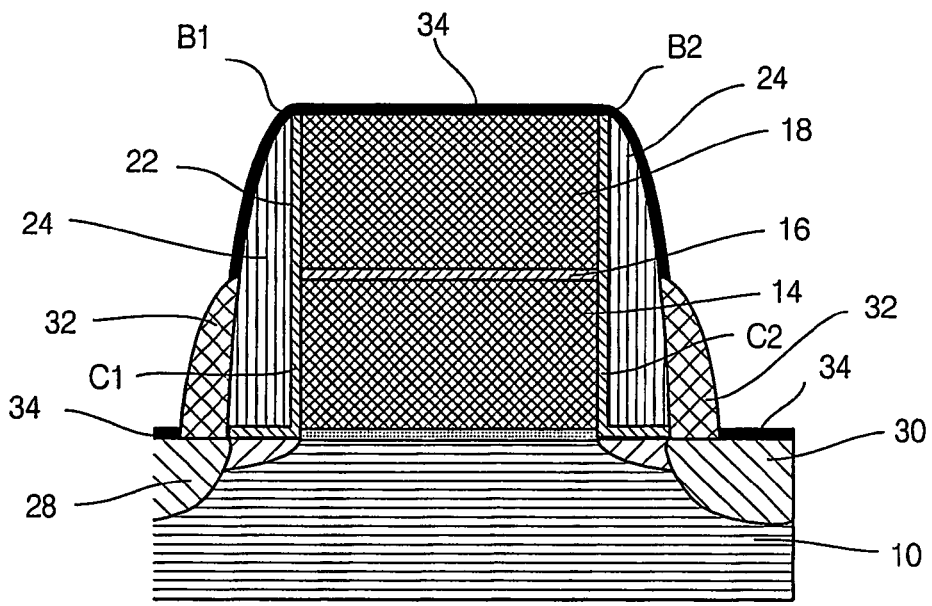
FIG. 9 is a schematic vertical cross-section of the semiconductor device of FIG. 7 after formation of a conductive layer over control gate and conductive spacers, which layer electrically connects the CG to the conductive spacers.

A cross section of a layout of an embodiment of a cell according to the present invention (with blanket layer as side wall dielectric 22) is shown in FIG. 9. It comprises a conventional stacked gate floating gate transistor on a substrate 10 with a planar surface, the stack 14, 16, 18 having opposite walls extending vertically with respect to the planar surface. The device according to the present invention has a conductive spacer 24 at both sides of the stack 14, 16, 18. The conductive spacers 24 are galvanically connected to the CG 18, for example by means of a conductive layer 34, e.g. a silicide layer. The conductive spacers 24 are separated from the FG 14 by means of a non-conducting layer 22. The capacitance between both conductive spacers 24 and the FG 14 (indicated by the labels C1, C2 in FIG. 9) adds up to the "normal" capacitance between the CG 18 and the FG 14 (across a dielectric layer 16 between FG 14 and CG 18), thus enhancing the mutual capacitive coupling considerably.

This is shown in the following indicative calculations:

If a flash transistor in a 0.12 CMOS process has the following dimensions (indicated in FIG. 1 and FIG. 2):

L=150 nm (transistor length)

W=160 nm (transistor width)

K=320 nm (width of the floating gate)

$t_{ox}$=8.5 nm (thickness of the tunnel oxide)

$t_{ipd}$=15 nm (equivalent electrical thickness of IPD)

h=150 nm (thickness of floating gate)

then, for a prior art device without conductive spacer, the following coupling ratio $\alpha_{cg}$ is obtained:

$$A_{ox}=W\times L=2.4\times 10^{-14}m^2 \Rightarrow C_{ox}=\epsilon_0\epsilon_r A_{ox}/t_{ox}=9.75\times 10^{-17}F$$

$$A_{ipd}=W\times(2h+K)=9.92\times 10^{-14}m^2 \Rightarrow C_{ipd}=\epsilon_0\epsilon_r A_{ipd}/t_{ipd}=2.28\times 10^{-16}F$$

$$\alpha_{cg}=C_{ipd}/(C_{ipd}+C_{ox})=0.69$$

For a device with conductive spacer according to the present invention, the following coupling ratio $\alpha_{cg}$ is obtained:
$C_{ox}$ stays unamended:

$$C_{ox}=\epsilon_0\epsilon_r A_{ox}/t_{ox}=9.75\times 10^{-17}F$$

$C_{ipd}$ becomes larger because $A_{ipd}$ has become larger:

$$A_{ipd}=W\times(2h+K)+(2h\times K)=1.95\times 10^{-13}m^2 \Rightarrow C_{ipd}=4.49\times 10^{-16}F$$

$$\alpha_{cg}=C_{ipd}/(C_{ipd}+C_{ox})=0.82$$

This means that, in the example given, an increase in the coupling ratio of 19% is obtained, or thus that the voltages needed for programming and erasing can be lowered almost 20%.

Thanks to this increased coupling coefficient, the cell can be programmed and/or erased at lower voltages, thus relaxing the requirements on the high voltage transistors in the peripheral circuit. Alternatively, not using decreased voltages, the increased coupling coefficient can be used to have faster erase and programming times.

The insulating layer 22 between the conductive spacers 24 and the substrate 10 should be able to sustain the high voltages occurring between source or drain regions 28, 30 and CG 18 during program and erase.

It is to be understood that although specific constructions and configurations, as well as materials, have been discussed herein for devices and methods according to the present invention, deviations can be made therein without departing from the spirit and scope of the present invention. For example, although the cell architecture in FIG. 9 is a simple 1-transistor flash cell, the same principle can be used for other cell types (e.g. 2-transistor flash cells) as well.

The invention claimed is:

1. Non-volatile floating gate semiconductor memory device with a floating gate to control gate coupling ratio, comprising:
    a substrate with a planar surface,
    a stack comprising a floating gate and a control gate on the substrate, the stack having two opposite walls extending substantially vertically with respect to the planar surface,
    a conductive spacer associated with each opposite wall of the stack,
    an insulating layer between each opposite wall of the stack and the associated conductive spacer,
    a galvanic contact between each conductive spacer and the control gate, and
    wherein the control gate is at least partially insulated from the conductive spacers by the insulating layer.

2. Semiconductor memory device according to claim 1, wherein the stack furthermore comprises a dielectric layer.

3. Semiconductor memory device according to claim 1, wherein the insulating layer is formed by means of a blanket layer.

4. Semiconductor memory device according to claim 1, wherein the insulating layer is formed by means of a spacer.

5. Semiconductor memory device according to claim 1, wherein the galvanic contact between the conductive spacers and the control gate is made with a conductive layer over at least a part of the conductive spacer and at least a part of the control gate.

6. Semiconductor memory device according to claim 1, wherein the conductive spacer comprises polysilicon.

7. Semiconductor memory device according to claim 1, furthermore comprising source and drain regions.

8. Semiconductor memory device according to claim 1, furthermore comprising insulating spacers alongside the conductive spacers.

9. Semiconductor memory device according to claim 2, wherein the insulating layer has an electrical thickness of the same order as the dielectric layer.

10. Semiconductor memory device according to claim 4, wherein the galvanic contact is formed by a direct contact between each conductive spacer and the control gate.

11. Semiconductor memory device according to claim 5, wherein the conductive layer is a silicide layer.

12. A non-volatile memory array, the non-volatile memory array comprising a plurality of cells, the cells including the semiconductor device according to claim 1.

13. Method for manufacturing on a substrate with a planar surface a non-volatile floating gate semiconductor memory device with a floating gate to control gate coupling ratio, comprising the steps of:
    forming a stack comprising a floating gate and a control gate on the substrate, the stack having two opposite walls extending substantially vertically with respect to the planar surface,
    forming a conductive spacer associated with each opposite wall of the stack,
    forming an insulating layer between each opposite wall of the stack and the associated conductive spacer, wherein the forming of an insulating layer between each opposite wall of the stack and the associated conductive spacer includes forming an insulating layer such that the control gate is at least partially insulated from the conductive spacers by the insulating layer; and
    forming a galvanic contact between each conductive spacer and the control gate.

14. Method according to claim 13, wherein the step of forming an insulating layer comprises depositing a blanket layer.

15. Method according to claim 13, wherein the step of forming an insulating layer comprises forming insulating spacers.

16. Method according to claim 13, wherein the step of forming a galvanic coupling between each conductive spacer and the control gate comprises forming a conductive layer over at least part of the control gate and at least part of the conductive spacers.

17. Method according to claim 13, wherein the step of forming the conductive spacers comprises depositing a conductive layer and anisotropically etching the conductive layer.

18. Method according to claim 13, wherein the step of forming a stack comprises the steps of
    depositing a floating gate layer,
    depositing a control gate layer, and
    etching the stack.

19. Method according to claim 13, furthermore comprising the steps of providing source and drain regions.

20. Method according to claim 13, furthermore comprising the steps of providing insulating spacers alongside the conductive spacers.

21. Method according to claim 16, wherein the control gate and the conductive spacers are silicidized.

22. Method according to claim 15, wherein the step of forming a galvanic contact comprises providing a direct contact between each conductive spacer and the control gate.

23. Method according to claim 18, furthermore comprising a step of depositing a dielectric layer between depositing the floating gate layer and depositing the control gate layer.

* * * * *